United States Patent
Chang et al.

[11] Patent Number: 6,089,479
[45] Date of Patent: Jul. 18, 2000

[54] METHOD FOR TREATING WASTE PRINTED CIRCUIT BOARDS WITH MOLTEN MIXTURE OF INORGANIC SALTS

[75] Inventors: Kuo-Ching Chang, Kaohsiung; Kuo-Jer Hwang; Gow-Guang Goan, both of Kaosiung Hsien; Wei-Hsin Li, Hsinchu, all of Taiwan

[73] Assignee: Cleanenv' Engineeering Consultant Co., Ltd., Kaohsiung Hsien, Taiwan

[21] Appl. No.: 09/406,726

[22] Filed: Sep. 28, 1999

[51] Int. Cl.[7] .............................. B02C 19/00; B02C 19/12
[52] U.S. Cl. .......................... 241/17; 241/23; 241/24.13; 241/24.18; 241/DIG. 38
[58] Field of Search ................................ 241/15, 17, 20, 241/23, 24.13, 24.18, DIG. 38

[56] References Cited

U.S. PATENT DOCUMENTS

| | | | |
|---|---|---|---|
| 3,210,182 | 10/1965 | Funari | 134/5 |
| 3,632,336 | 1/1972 | Cameron | 75/417 |
| 4,874,486 | 10/1989 | Hanulik | 205/704 |
| 5,678,775 | 10/1997 | Chapman | 241/79.1 |
| 5,683,040 | 11/1997 | Jakob et al. | 241/14 |
| 5,843,287 | 12/1998 | Wicks et al. | 204/157.15 |
| 5,887,805 | 3/1999 | Chapman | 241/24.13 |
| 5,979,033 | 11/1999 | Chang et al. | 241/23 X |

*Primary Examiner*—John M. Husar
*Attorney, Agent, or Firm*—Rosenberg, Klein & Lee

[57] ABSTRACT

A method for treating waste printing circuit boards with molten mixture of inorganic salts comprising actions of: (1) putting the circuit boards into the molten inorganic salts contained in a treating furnace; (2) crushing and stirring for copper foil of the circuit boards to be separated therefrom; (3) further stirring to separate the foil from the plastic and the glass fiber of the circuit boards; (4) scraping the floating residues of the plastic and the glass fiber on upper surface of the molten inorganic salts with a floating residues scraping device; (5) collecting the carbonized plastic residues and the glass fiber; (6) converting waste gas produced in the process into an unharmful and stable one; and (7) removing the copper foil by a certain amount regularly with a removing device.

2 Claims, 2 Drawing Sheets

METHOD FOR TREATING WASTE PRINTED CIRCUIT BOARDS WITH MOLTEN MIXTURE OF INORGANIC SALTS

BACKGROUND OF THE INVENTION

Waste printed circuit boards cannot be decomposed naturally and have to be treated with certain processes. Otherwise the environment will be seriously polluted.

The inventor of the present invention has introduced a method for treating waste printed circuit boards with molten tin or its alloy, which was filed for patent application in U.S. Patent and Trademark Office on May 5, 1998 with filing number 09/072,136 now U.S. Pat. No. 5,979,033.

The method in the last application includes the following actions.

1. The waste printed circuit boards are put into a bath containing molten tin, and the bath is located in a treating furnace.
2. The waste circuit boards are crushed and the molten tin is stirred so as to remove copper foil from the circuit board, which is carbonized.
3. Further stirring separates the copper foil, the thermosetting plastic, and the glass fiber from one another.
4. The thermosetting plastic residues and the glass fiber, which floats on an upper surface of the molted tin, are scraped off with a scraping device, and collected in a collect tank.
5. Volatile gases produced in the carbonizing process of the thermosetting plastic is burned and decomposed by a buner. The rest of the volatile gases which is not completely decomposed is led to a combustion chamber located outside the treating furnace, and then converted into stable gases.
6. The copper foil is collected in a metal collect tank.

However, it is found that the method for treating waste printed circuit board with molten tin still has undesirable features as follows.

1. Using tin as a heating medium makes the method cost relatively much higher due to cost of tin.
2. The tin will more or less adhere to the removed copper foil and the removed glass fiber. Therefore, requiring further separation and making the same unable to be as pure as desired for recycling.

SUMMARY

It is the object of the present invention to provide a method for treating waste printed circuit boards whereby the discarded printed circuit boards won't pollute the environment, and the substance removed from the circuit boards such as copper foil and glass fiber can be recycled.

It is another object of the present invention to provide a method for treating waste printed circuit boards, which have minimum cost by using molten mixture of inorganic salts as the heat medium.

The method for treating waste printed circuit boards with molten mixture of inorganic salts comprises actions as follows.

A method for treating waste printing circuit boards with molten mixture of inorganic salts, comprising actions:

(1) putting said waste circuit boards in a treating furnace; crushing and stirring the circuit boards with a crushing and stirring device for copper foil of the circuit boards to be separated therefrom, thermosetting plastic of the circuit boards being carbonized under said crushing and stirring action;

(2) further stirring the circuit boards with the crushing and stirring device for the copper foil, the thermosetting plastic and glass fiber of the circuit boards to separate from one another due to difference in density;

(2-1-1) scraping floating residues of the thermosetting plastic and the glass fiber which floats on upper surface of the molten mixture of inorganic salts with a floating residues scraping device;

(2-1-2) collecting the scraped thermosetting plastic and the scraped glass fiber with a floating residues collecting tank;

(2-2-1) destroying volatile gases produced when the thermosetting plastic is being carbonized with a burner;

(2-2-2) sending part of the volatile gases which have not been destroyed into a combustion chamber, and converting same into the stable gases;

(2-3-1) removing the copper foil by a certain amount regularly; and, (2-3-2) collecting the removed copper foil in a metal collect tank.

The inorganic salts can be sodium nitrate sodium nitrite, potassium nitrate, ammonium nitrate, lithium nitrate, or mixture of two or more of above.

Because the inorganic salts utilized as heat medium are not metals, they won't tightly adhere to, or combine with the copper foil or the glass fiber. So, the removed copper foil is pure enough for recycling.

The costs of the inorganic salts are lower than that of the tin used in the prior art treating method. So, the method of the present invention costs relatively little.

BRIEF DESCRIPTION OF THE DRAWINGS

The present invention will be better understood by reference to the accompanying drawings, wherein.

DETAILED DESCRIPTION OF THE PREFERRED EMBODIMENTS

Figure 1:
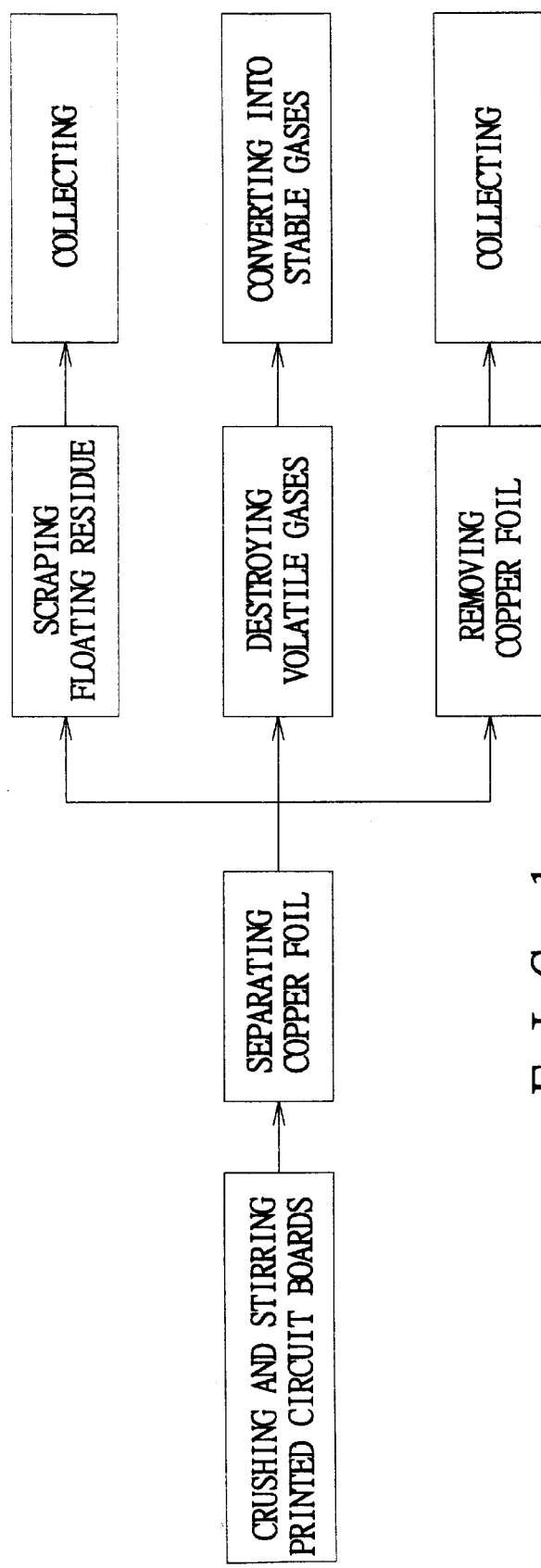
FIG. 1 is a flow chart of a method for treating waste printed circuit board with molten mixture of inorganic salt of the present invention.
Figure 2:
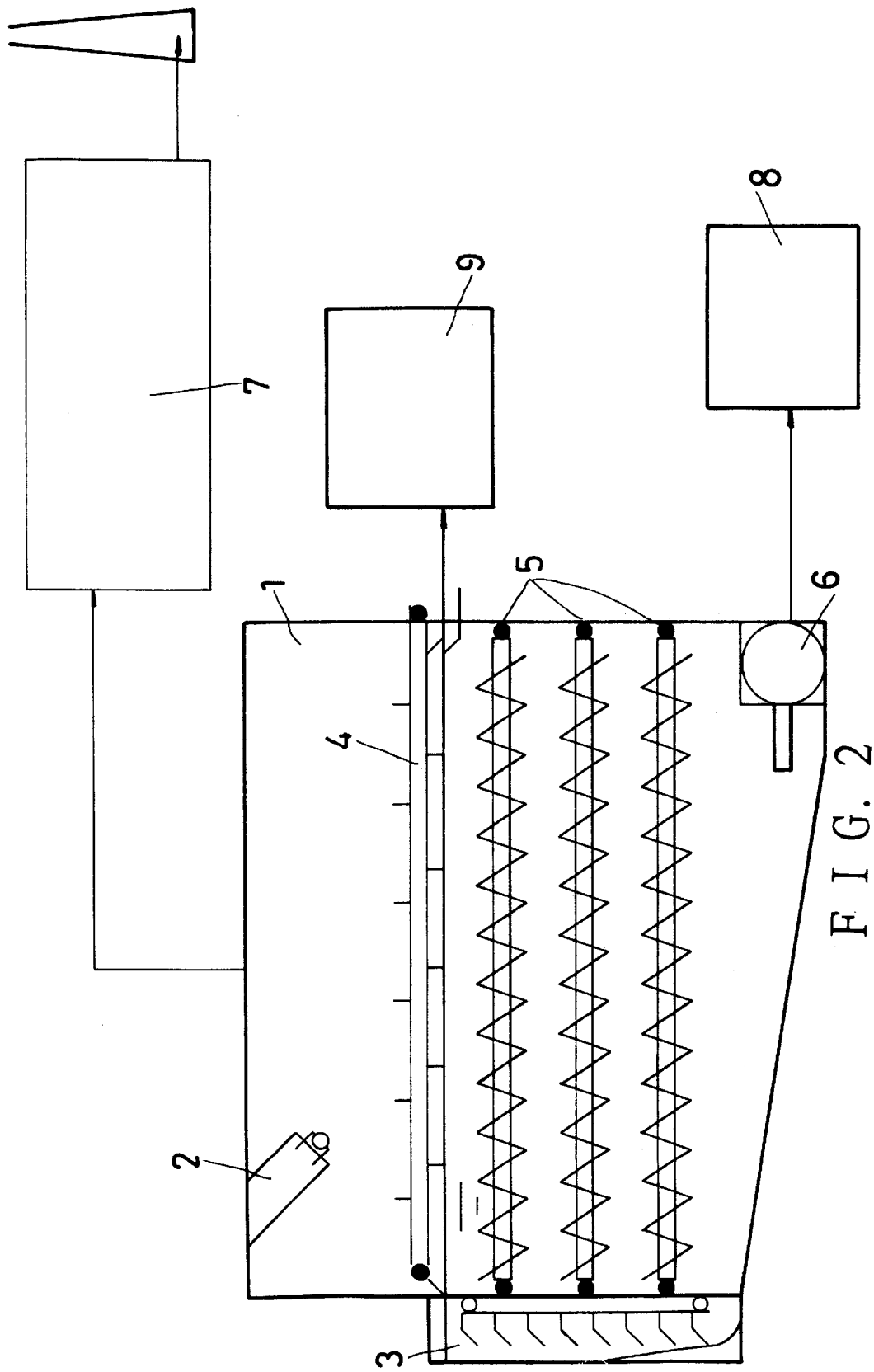
FIG. 2 is a schematic showing the components of the device for treating waste printed circuit board with molten mixture of inorganic salt of the present invention.

Referring to FIGS. 1 and 2, a method for treating waste printed circuit boards with molten mixture of inorganic salts of the present invention comprises actions as follows.

1. The waste printed circuit boards are put in a treating furnace 1 containing the molten mixture of inorganic salts for the circuit boards to fully contact with the molten mixture of inorganic salts in the treating furnace 1. Then, the circuit boards are crushed and stirred for copper foil thereon to be separated therefrom; the thermosetting plastic of the circuit boards will at the same time be carbonized.

2. The carbonized circuit boards are further stirred such that the copper foil, the thermosetting plastic, and glass fiber thereof can separate from one another due to their different densities.

2-1-1: The copper foil will settle down to the bottom; the carbonized thermosetting plastic and the glass fiber will float on an upper surface, which are scraped off with a floating residues scraping device 5.

2-1-2: The scraped off thermosetting plastic residues and the glass fiber are collected in a floating residues collecting tank 9.

2-2-1: Volatile gases, which are produced in carbonizing the thermosetting plastic, are burned and destroyed with a burner 2.

2-2-2: Part of the volatile gases, which are not completely destroyed, are led to a combustion chamber 7, and then converted into the stable gases.

2-3-1: The copper foil separated from the thermosetting plastic and the glass fiber is removed by a certain amount regularly.

2-3-2: The removed copper foil is collected in a metal collect tank.

The inorganic salts can be sodium nitrate sodium nitrite, potassium nitrate, ammonium nitrate, lithium nitrate or mixture of two or more of above; the above chemicals are very suitable for use as the heating medium because they are very stable, and not harmful, under a certain temperature.

Thus, the copper foil, the thermosetting plastic, and the glass fiber can be collected and recycled. And, the volatile gases produced when the thermosetting plastic is being carbonized are converted into the stable gases, preventing the same from polluting the atmosphere.

The burner 2 is mounted on the treating furnace 1; the burner 2 is used to melt the inorganic salts in the treating furnace 1.

A feeding device 3 is provided for feeding the waste printing circuit boards to the treating furnace 1.

A plurality of crushing and stirring devices 4 are provided in the treating furnace 1 for crushing and stirring the circuit boards such that the circuit boards can have more contact area with the molten mixture of inorganic salts.

A floating residues scraping device 5 is located above the crushing and stirring device 4, and connected to the floating residues collecting tank 9 for scraping the thermosetting plastic and the glass fiber, which are then collected in the floating residues collecting tank.

A removing device 6 is located on the bottom of the treating furnace 1, and connected to a metal collect tank 8 for sending the copper foil setting down on the bottom of the treating furnace 1 to the metal collect tank 8 by a certain amount regularly.

Furthermore, a combustion chamber 7 is located outside and connected to the treating furnace 1 for burning that part of the volatile gases which have not been completely destroyed by the burner 2, and for converting the same into unharmful stable gases before the same is released to the atmosphere.

From the above description, it can be understood that the method of the present invention has desirable features as follows.

1. Because the inorganic salts used as heating medium are not metals, they won't tightly adhere to or combine with the copper foil, the thermosetting plastic, or the glass fiber. Consequently, the removed copper foils are much more purer.

2. The costs of the inorganic salts are much lower than that of the tin used in the prior art method.

3. Being relatively pure, the copper foil and the glass fiber can be directly recycled.

What is claimed is:

1. A method for treating waste printed circuit boards with molten mixture of inorganic salts, comprising the steps of:

putting said waste circuit boards in a treating furnace having heating medium; crushing and stirring said circuit boards with a crushing and stirring device for copper foil of said circuit boards to be separated therefrom, thermosetting plastic of said circuit boards being carbonized under said crushing and stirring action;

further stirring said circuit boards with said crushing and stirring device for said copper foil, said thermosetting plastic and glass fiber of said circuit boards to separate from one another due to difference in density;

scraping floating residues of said thermosetting plastic and said glass fiber which float on upper surface of said molten mixture of inorganic salts with a floating residues scraping device;

collecting said scraped thermosetting plastic and said scraped glass fiber with a float collecting tank;

destroying volatile gases produced when said thermosetting plastic is being carbonized with a burner;

sending part of said volatile gases which have not been destroyed into a combustion chamber, and converting the same into the stable gases;

removing said copper foil with a removing device at regular intervals; and, collecting said removed copper foil in a metal collect tank; characterized in said heating medium in said treating furnace is molten mixture of inorganic salts.

2. The method for treating waste printed circuit boards with molten mixture of inorganic salts as claimed in claim 1, wherein said molten mixture of said inorganic salts used as heating medium can be a mixture of substances selected from a group consisting of potassium nitrate, sodium nitrate, sodium nitrite, ammonium nitrate, lithium nitrate.

* * * * *